United States Patent
Koo et al.

(10) Patent No.: US 8,263,944 B2
(45) Date of Patent: Sep. 11, 2012

(54) DIRECTIONAL GAS INJECTION FOR AN ION SOURCE CATHODE ASSEMBLY

(75) Inventors: John Bon-Woong Koo, Andover, MA (US); David J. Twiss, Topsfield, MA (US); Chris Campbell, Newburyport, MA (US); Frank Sinclair, Quincy, MA (US); Alexander S. Perel, Danvers, MA (US); Craig R. Chaney, Rockport, MA (US); Wilhelm P. Platow, Somerville, MA (US); Eric R. Cobb, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 186 days.

(21) Appl. No.: 12/340,812

(22) Filed: Dec. 22, 2008

(65) Prior Publication Data
US 2010/0155619 A1 Jun. 24, 2010

(51) Int. Cl.
*H01J 27/00* (2006.01)

(52) U.S. Cl. ............... 250/424; 250/423 R; 250/492.21

(58) Field of Classification Search .................. 250/424
See application file for complete search history.

(56) References Cited

U.S. PATENT DOCUMENTS

| 5,814,819 | A | 9/1998 | Sinclair et al. |
| 6,135,128 | A | 10/2000 | Graf et al. |
| 6,329,650 | B1 | 12/2001 | Dudnikov |
| 6,756,600 | B2 * | 6/2004 | Ng et al. .................. 250/492.21 |
| 6,891,173 | B2 | 5/2005 | Gammel et al. |
| 6,992,311 | B1 | 1/2006 | Ring et al. |
| 7,791,047 | B2 * | 9/2010 | Horsky et al. ............ 250/492.21 |
| 7,834,554 | B2 * | 11/2010 | Horsky ..................... 315/111.81 |
| 2006/0086376 | A1 * | 4/2006 | Dimeo et al. ................ 134/22.1 |
| 2007/0137671 | A1 | 6/2007 | DiVergilio et al. |

OTHER PUBLICATIONS

Bishop, Steve, et al., "The Development of In-Situ Ion Implant Cleaning Processes", CP866 Ion Implantation Technology, American Institute of Physics; pp. 477-480, 2006.

* cited by examiner

*Primary Examiner* — Phillip A. Johnston

(57) ABSTRACT

In an ion implanter, an inert gas is directed at a cathode assembly near an ion source chamber via a supply tube. The inert gas is provided with a localized directional flow toward the cathode assembly to reduce unwanted concentrations of cleaning or dopant gases introduced into the ion source chamber, thereby reducing the effects of unwanted filament growth in the cathode assembly and extending the manufacturing life of the ion source.

16 Claims, 4 Drawing Sheets

DIRECTIONAL GAS INJECTION FOR AN ION SOURCE CATHODE ASSEMBLY

BACKGROUND OF THE INVENTION

1. Field of the Invention

Embodiments of the invention relate to the field of semiconductor device fabrication. More particularly, the present invention relates to an apparatus and method for cleaning a cathode assembly of an ion source chamber used in ion implantation equipment.

2. Discussion of Related Art

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some embodiments, a second deceleration stage 112 may be disposed between corrector magnet 110 and support 114. The ions lose energy when they collide with electrons and nuclei in the substrate and come to rest at a desired depth within the substrate based on the acceleration energy.

The ion source chamber 102 typically includes a heated filament which ionizes a feed gas introduced into the chamber to form charged ions and electrons (plasma). The heating element may be, for example, a Bemas source, an indirectly heated cathode (IHC) assembly or other thermal electron source. Different feed gases are supplied to the ion source chamber to obtain ion beams having particular dopant characteristics. For example, the introduction of $H_2$, $BF_3$ and $AsH_3$ at relatively high chamber temperatures are broken down into mono-atoms having high implant energies. High implant energies are usually associated with values greater than 20 keV. For low-energy ion implantation, heavier charged molecules such as decaborane, carborane, etc., are introduced into the source chamber at a lower chamber temperature which preserves the molecular structure of the ionized molecules having lower implant energies. Low implant energies typically have values below 20 keV. When a particular feed gas is supplied to source chamber 102 to produce a desired ion species, additional unwanted species, either ions or neutrals, may also be produced. These unwanted species typically have low vapor pressure and may condense and adhere to the interior surfaces of the source chamber. For example, when phosphine ($PH_3$) is fed into the source chamber, phosphorous (P) deposits may form on the chamber walls. When heavy molecules such as decaborane and carborane are fed into the source chamber, unwanted deposits on the source chamber walls and electrodes is more prevalent. These solid deposits may change the electrical characteristics (voltage instability) of the chamber walls and possibly interfere with the ion source aperture from which the ions are extracted, thereby causing unstable source operation and non-uniform beam extraction.

One method used to clean the ion source chamber includes the introduction of a cleaning gas such as, for example nitrogen triflouride ($NF_3$) or sulfur hexaflouride ($SF_6$) which etches away the unwanted deposited material via plasma-enhanced chemical reaction. These gases are supplied to the ion source chamber at high flow rates thus maintaining high-pressure to effectively clean the interior of the chamber. However, these high flow rates cause the fluorine containing gases to diffuse and travel to other components near the ion source chamber. In particular, these gases may diffuse to the cathode assembly of the IHC. Because the cathode assembly is active during cleaning operation to increase the temperature within the source chamber and the reaction of the cleaning gases, an electro-thermal reaction occurs at the cathode assembly which produces additional deposits being formed on the filament. These filament growths may cause electrical shorts in the IHC and therefore cause equipment downtime for source PM. In addition, because the cleaning gases are introduced into the source chamber at relatively high flow rates, a need exists to reduce these rates in the area of the IHC to reduce unwanted filament growth while not compromising the pressure and flow rates needed for effective cleaning within the ion source chamber. Thus, there is a need for enhancing ion source cleaning to increase efficiency and unnecessary equipment downtime of ion implanters while not negatively impacting source components during the cleaning process. In addition, there is a need to provide a localized inert gas directed toward the filament/cathode region at a relatively low flow rate to extend the source lifetime while not effecting the ion source performance during normal implanter operation.

SUMMARY OF THE INVENTION

Exemplary embodiments of the present invention are directed to an apparatus and method for suppressing unwanted filament growth in an ion source utilized in an ion implanter. In an exemplary embodiment, an ion implanter includes an ion source chamber having interior surfaces where a cleaning gas at a predetermined pressure is introduced into the chamber to remove deposits from the interior surfaces of the chamber. An indirectly heated cathode is located at a first end of the ion source chamber which includes a cathode assembly. A supply tube proximate the cathode assembly is configured to provide a gas to the indirectly heated cathode such that the predetermined pressure of the cleaning gas is reduced in the area of the cathode assembly.

DESCRIPTION OF EMBODIMENTS

Figure 1:
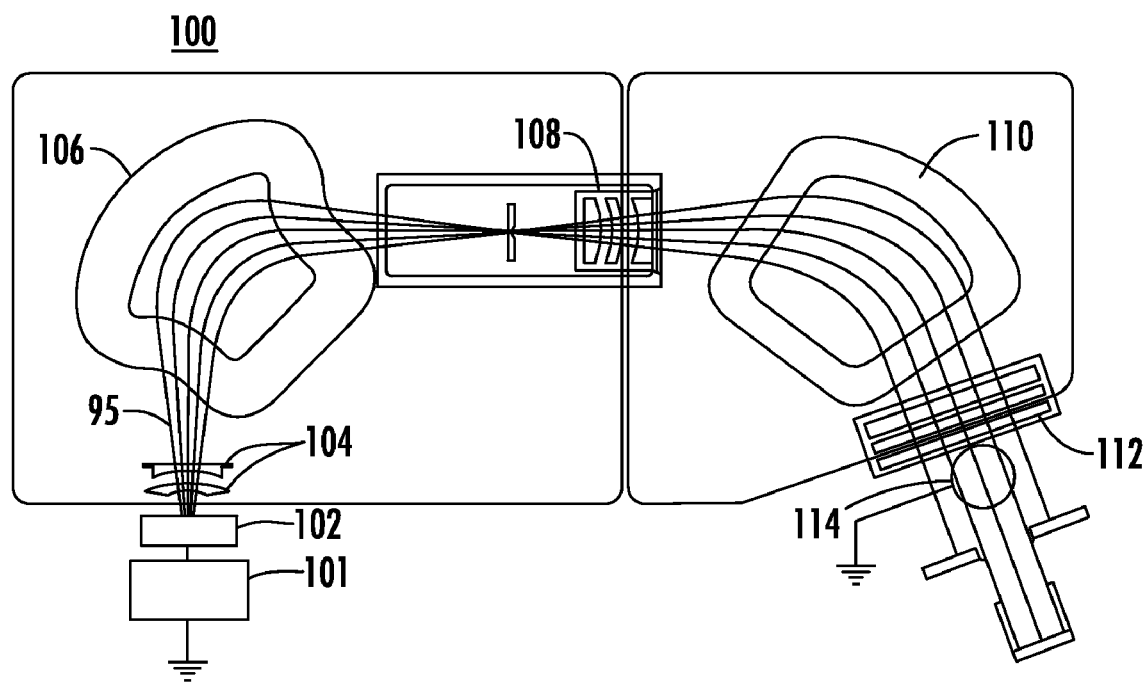
FIG. 1 illustrates a block diagram of a representative ion implanter.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
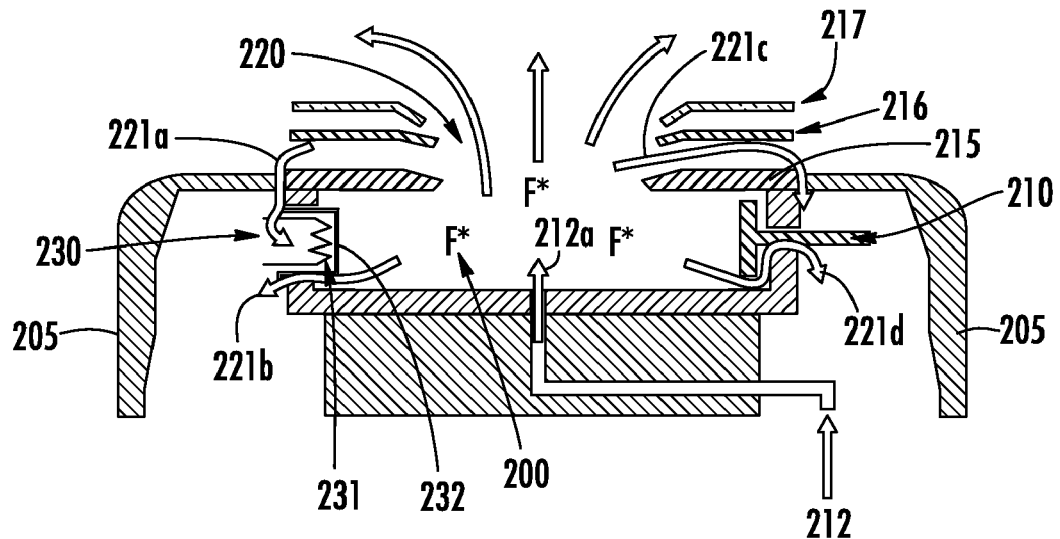
FIG. 2 illustrates a block diagram of an ion source.

FIG. 2 is a cross sectional block diagram generally illustrating an ion source chamber 200 used to generate ions for implantation into a substrate. Chamber 200 is disposed on source bushings 205 and includes aperture 220 through which ions are extracted. The ions are extracted from source chamber 200 via a standard three (3) electrode configuration comprising plasma electrode 215, suppression electrode 216 and ground electrode 217 used to create an electric field. Although suppression electrode 216 is shown as being spaced apart from ground electrode 217, this is for illustrative purposes only and the electrodes are physically in contact with each other via insulators. Plasma electrode 215 may be biased at the same large potential as ion source chamber 200. Suppression electrode 216 is connected to a power supply and is typically biased at a moderate negative value to prevent electrons from entering back into source chamber 200. Ground electrode 217 is positioned downstream from suppression electrode 216 and is at ground potential. The strength of the electric field generated by the electrodes can be tuned to a desired beam current to extract a particular type of ion beam from the ions generated in chamber 200.

Ion source chamber 200 is an indirectly heated cathode chamber which includes a cathode/filament assembly 230 located at one end of the ion source chamber 200. A filament 231 is positioned in close proximity to cathode 232 outside the ion chamber. A voltage is supplied to filament 231 which produces enough current through the filament to heat it and produce thermo-electrons. Cathode 232 is indirectly heated via filament 231 by biasing the cathode more positively than the filament which causes these thermo-electrons to accelerate from filament 231 toward cathode 232, thereby heating the cathode. Cathode 232 emits thermo-electrons into the ion source chamber 200 which ionizes a dopant gas introduced into the chamber forming plasma. A repeller 210 is positioned on the opposite end of the ion source chamber 200 and is typically biased to the same voltage as cathode 232. The emitted electrons are confined between the cathode 232 and repeller 210 which collide with the dopant feed gas to generate desired plasma.

As noted above, when a feed gas is supplied to the ion source chamber to produce a desired ion species, additional unwanted species may also be produced which deposit on the interior walls of chamber 200. These deposits may be cleaned by introducing a cleaning gas into chamber 200. In particular, conduit 212 is positioned to introduce cleaning gases into chamber 200 as indicated by arrow 212a. During normal (non-cleaning cycle) ion source operation, conduit 212 is used to introduce dopant gas into the source chambe 200. For example, nitrogen triflouride ($NF_3$) or sulfur hexaflouride ($SF_6$) may be supplied into the chamber 200 via conduit 212 at relatively high flow rates (e.g. 100 sccm or higher) such that reactive atomic fluorine is generated by the disassociation of $NF_3$ into the nitrogen-containing and fluorine-containing molecules and atoms. Introduction of theses cleaning gases is performed in situ and may be introduced simultaneously with the dopant species or as a separate cleaning plasma during equipment down time and/or between specie changes. These fluorine containing cleaning gases undergo chemical reactions inside the source chamber 200 via plasma and/or thermal chemistries thereby generating highly-reactive meta-stable species of fluorine (denoted as F* in FIG. 2). These specie etch the deposits formed on the walls of chamber 200. However, the fluorine containing gases and the etchant fluorine F* also diffuse into the surrounding area, including the region where the cathode/filament assembly is located. This diffusion causes the fluorine F* to fill areas other than chamber 200. For example, the etchant fluorine F* may diffuse: (a) out aperture 220 and between bushing 205 and plasma electrode 215 as indicated by arrow 221a; (b) between cathode 232 and a wall of chamber 200 as indicated by arrow 221b; (c) out aperture 220 and between bushing 205 and plasma electrode 215 as indicated by arrow 221c; and/or (d) between repeller 210 and a wall of source chamber 200 as indicated by arrow 221d. The etchant gas that diffuses around the cathode/filament assembly 230 causes additional fluorine F* to be generated as a result of electro-thermal reactions of the gas between filament 231 and cathode 232. In particular, the high temperature and pressure of fluorine etchant in the filament/cathode assembly region causes the filament material (typically tungsten) to evaporate and deposit onto filament 231 as a porous material having a larger volume, but with the same mass as before evaporation. This causes electrical shorts between the filament 231 and cathode 232 negatively impacting source life.

Figure 3:
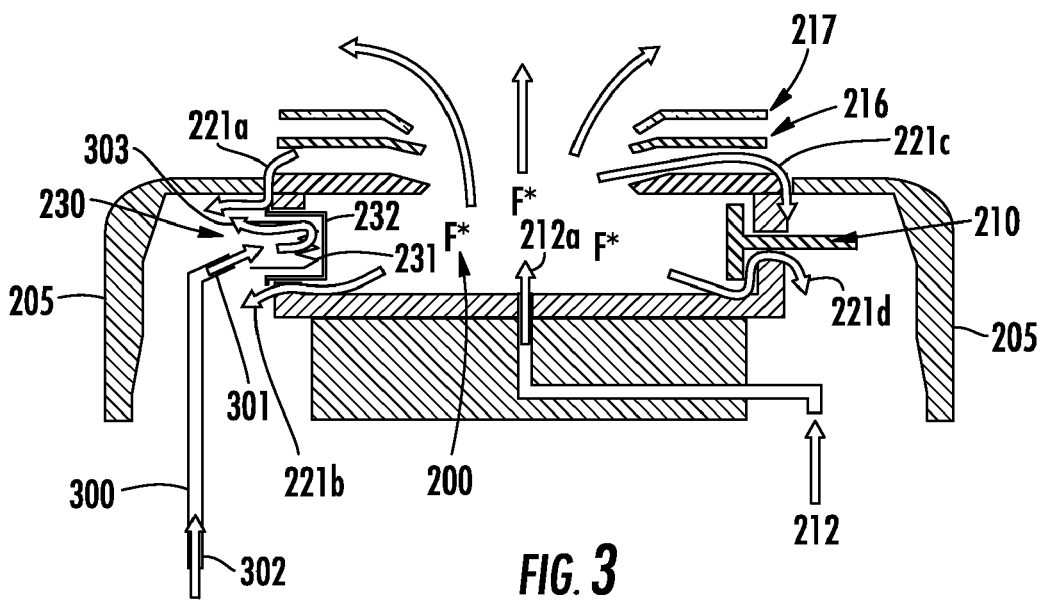
FIG. 3 is a cross sectional block diagram of an ion source in accordance with an embodiment of the present invention.

FIG. 3 illustrates a cross-sectional view of ion source 200 including filament/cathode assembly 230 and repeller 210. An injection tube 300 is included and positioned for distribution of an inert gas toward filament/cathode assembly 230. In particular, a tube 300 has a first end 301 positioned near filament/cathode assembly 230 and a second end 302 configured to receive a supply of an inert gas in the direction shown by the associated arrows. Tube 300 may have, for example, a diameter D which is 0.1 inches and a length L of 0.5 inches, thus the aspect ratio may be 5:1 or larger. Regardless of the specific dimensions, tube 300 is designed to have a relatively high aspect ratio to ensure that the directional flow of the inert gas is localized to the desired area, for example filament/cathode assembly 230 as indicated by arrow 303. The inert gas introduced via tube 300 may be, for example nitrogen, argon, hydrogen, helium, etc. The introduction of the inert gas reduces the partial pressure of the fluorine in that region. The flow rate of the inert gas is in the range of 1-100 sccm which is much less than the flow rate of the cleaning gas introduced into chamber 200 via conduit 212. The difference in flow rates between the inert gas introduced via tube 300 and the cleaning gas introduced via tube 212 does not effect the meta-stable species of fluorine F* which act as the etchant within chamber 200. The directional flow of the inert gas reduces the fluorine concentration in the area of the filament/cathode assembly 230 which suppresses unwanted growth of filament 232. In this manner, the partial pressure of the fluorine and etchant (F*) in the filament/cathode assembly region is reduced via localized and directional injection of an inert gas via tube 300, thereby reducing deposits in this area and extending the lifetime of source 200.

Figure 4:
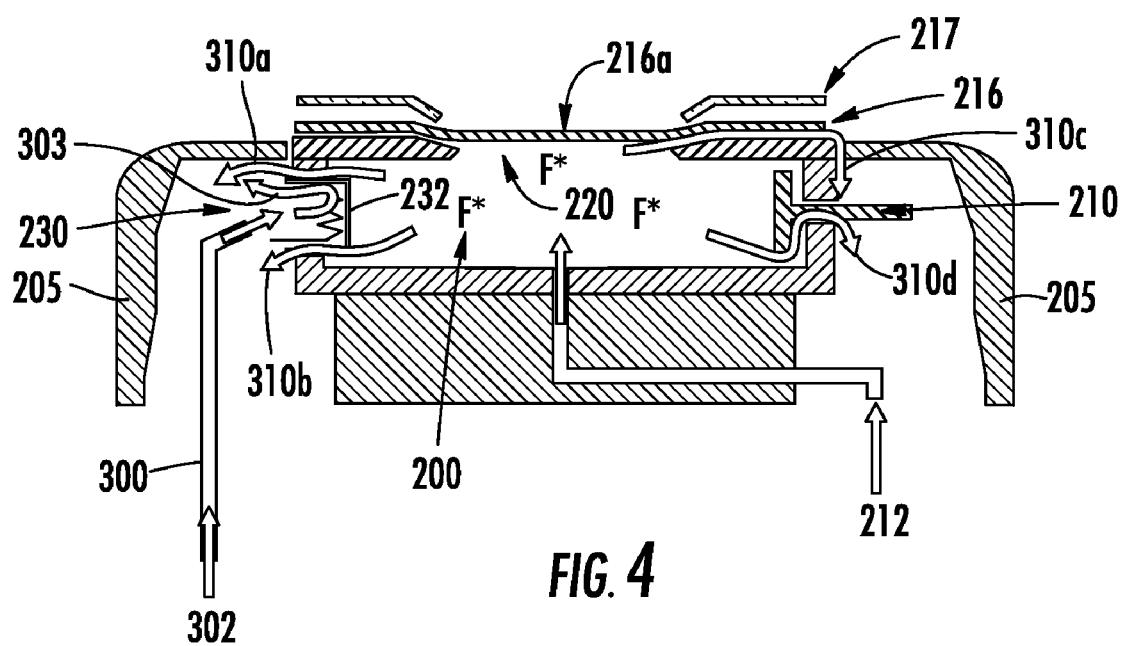
FIG. 4 is a cross sectional block diagram illustrating engagement of a suppression plug with an extraction aperture of the ion source in accordance with an embodiment of the present invention.

FIG. 4 illustrates a cross sectional view of ion source chamber 200 including a suppression electrode having a suppression plug. The configuration of such a suppression electrode is disclosed in co-pending U.S. application Ser. No. 12/143, 247 assigned to the assignee of the present invention the contents of which are incorporated herein by reference. In particular, suppression electrode 216 includes a suppression plug portion 216a having a shape that corresponds to the geometry of aperture 220 of source chamber 200. Suppression plug portion 216a may be a dual mode (as disclosed in U.S. application Ser. No. 12/143,247) or a single mode suppression electrode which includes plug portion 216a configured as to not interfere with the extracted ion beam through a slot (not shown) in suppression electrode 216. Suppression plug portion 216a may be integrally formed with suppression electrode 216 and may be made from, for example, tungsten.

The suppression plug portion 216a is shown as being engaged with aperture 220 which adjusts the gas conductance through aperture 220. Once suppression plug portion 216a is positioned over or in close proximity to source aperture 220, a cleaning gas (for example, nitrogen triflouride ($NF_3$) or sulfur hexaflouride ($SF_6$)) is fed into the ion source chamber 200 via conduit 212 as mentioned above. This produces a plasma-enhanced chemical reaction inside source chamber 200 to etch away unwanted deposited material from the interior walls of the chamber. By positioning suppression plug portion 216a proximally with aperture 220, the gas pressure inside the source chamber 200 can be increased significantly at a relatively lower flow rate. The position of suppression plug portion 216a may be adjusted depending on the pressure requirement inside source chamber 200 for optimum cleaning. For example, if a moderate pressure is required for cleaning, a reasonable gap between aperture 220 and suppression plug portion 216a may be set, thereby allowing the pressure inside source chamber 200 to increase as well as allowing etchant gas leakage. If maximum pressure is required for cleaning, then the position of suppression plug portion 216a can be periodically adjusted during the cleaning process from, for example, complete closure of aperture 220 to inhibit gas leakage to a certain distance from aperture 220 to allow leakage of the etched deposit material in gas form from chamber 200. The periodic movement of suppression plug portion 216a toward and away from aperture 220 may be adjusted, for example 1-100 times/min during the cleaning process. The cleaning gas which reacted with the ion beam escapes through aperture 220, thus removing the unwanted deposits via a gaseous waste stream.

Because the necessary pressure for effective chamber cleaning is provided in part through the engagement of suppression plug 216a with aperture 220, the flow rate of the cleaning gas is significantly reduced. At this reduced flow rate, the diffusion pattern of the fluorine containing gases and the etchant fluorine F* is dissimilar to that disclosed with reference to FIG. 3. In particular, the diffusion pattern may be present through the spacing between: (a) source chamber 200 and cathode 232 as indicated by arrows 310a and 310b; (b) suppression electrode 216 and source chamber 200 as indicated by arrow 310c; and/or (c) repeller 210 and source chamber 200 as indicated by arrow 310d. An inert gas is introduced to the filament cathode assembly 230 via tube 300 which reacts with the etchant fluorine F*. The partial pressure of the fluorine gas and etchant fluorine F* in the area of the filament/cathode assembly is reduced. Since the flow rate of the cleaning gas introduced into chamber 200 via conduit 212 is reduced with the engagement of suppression plug portion 216a proximal to aperture 220, the flow rate of the inert gas introduced toward filament/cathode assembly 230 via tube 300 is also reduced. In this manner, the directional flow of the inert gas reduces the fluorine concentration in the area of the filament/cathode assembly 230 which suppresses unwanted growth on filament 232.

Figure 5:
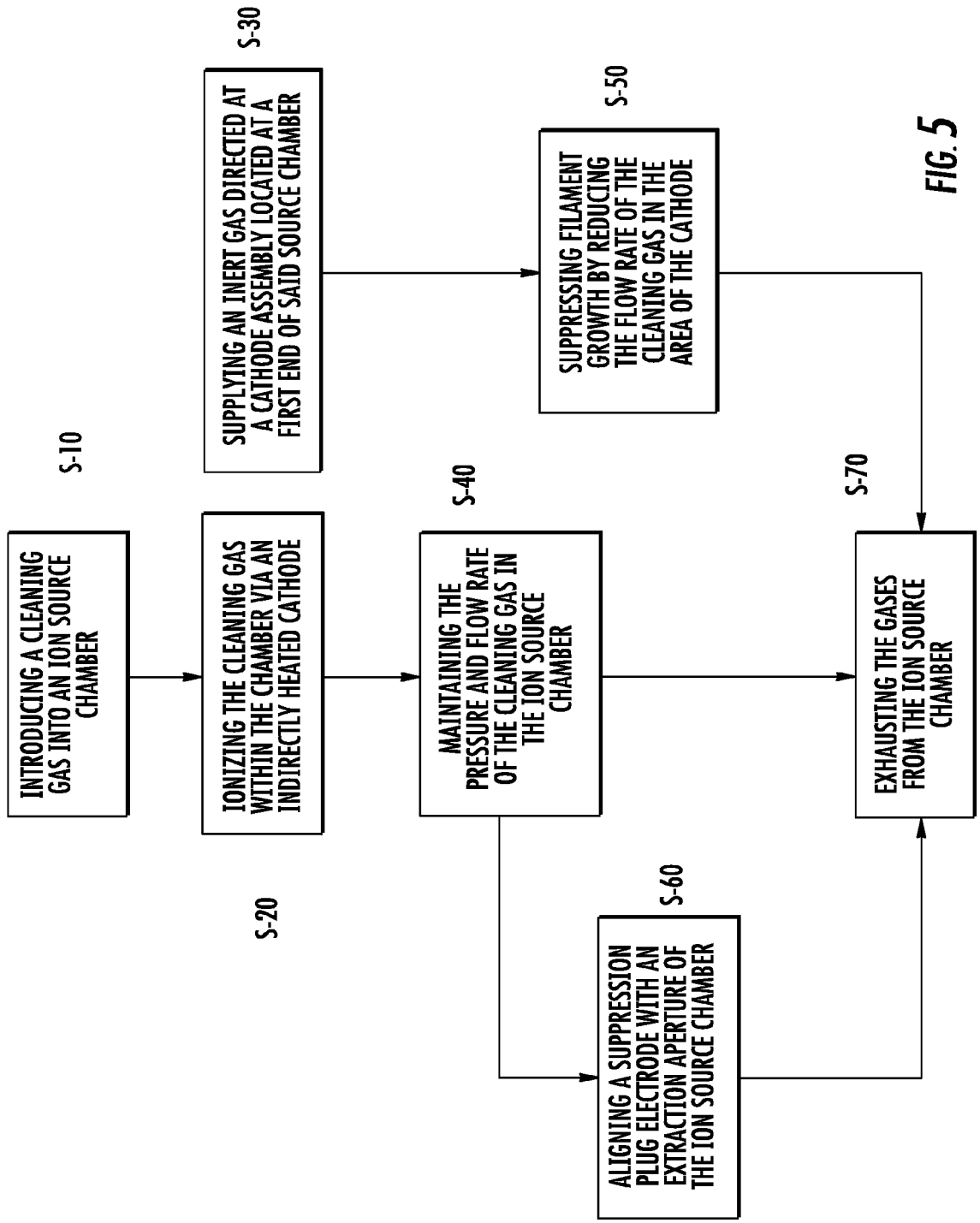
FIG. 5 is a flow chart representing an exemplary cleaning process in accordance with an embodiment of the present invention.

FIG. 5 is a flow chart illustrating a process of cleaning an ion source chamber within an ion implanter. A cleaning gas such as nitrogen triflouride ($NF_3$) or sulfur hexaflouride ($SF_6$) is introduced into the ion source chamber 200 via conduit 212 at step S10. The cleaning gas is ionized within the chamber by providing the gas at an appropriate temperature and flow rate at step S20. The indirectly heated cathode assembly 230 is used to heat the gas within the ion source chamber 200. As the cleaning gas is being ionized and/or broken into highly-reactive etchant atoms within the source chamber, an inert gas is directed at the cathode assembly 230 via tube 300 at step S-30. The pressure of the cleaning gas is maintained within the source chamber 200 by adjusting the flow rate at step S-40 to effectuate efficient cleaning of the inside walls of the chamber. A suppression plug portion 216a of suppression electrode 216 may be displaced into alignment with chamber aperture 220 at step S-50 to increase the pressure of the cleaning gas within chamber 200. The engagement of the suppression plug portion 216a with aperture 220 may be adjusted and regulated during the cleaning process. The cleaning gas may diffuse through various locations around chamber 200 including the cathode assembly 230. The concentration of the cleaning gas in the area of the cathode assembly 230 is reduced by the inert gas introduced via tube 300 at step S-60. The gases remaining in the ion source chamber are exhausted at step S-70. In this manner, the partial pressure of the cleaning gases and etchant in the filament/cathode assembly region is reduced via localized and directional injection of an inert gas, thereby reducing unwanted deposits that may effect operation of the ion source.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An ion source assembly comprising:
    an ion source chamber configured to receive a first gas;
    an indirectly heated cathode having a filament and a cathode located at a first end of said ion source chamber; and
    a supply tube proximate said filament configured to provide a second gas toward said filament and said cathode such that a pressure of said first gas is reduced near said filament, said filament and said cathode configured to be powered when the second gas is provided toward said filament.

2. The ion source assembly of claim 1 wherein said supply tube has an aspect ratio sufficient to provide directional flow of said second gas from said tube to said filament.

3. The ion source assembly of claim 1 wherein said second gas is an inert gas selected from the group consisting of nitrogen, argon, hydrogen, and helium.

4. The ion source assembly of claim 1 wherein said first gas includes dopant impurities to facilitate the generation of ions within said ion source chamber.

5. The ion source assembly of claim 1 wherein said ion source chamber includes interior surfaces, said first gas is a cleaning gas supplied to said ion source chamber to facilitate removal of deposits from said interior surfaces.

6. A method of directional gas injection in an ion source chamber of an ion implanter comprising:
    introducing a first gas into said ion source chamber;
    ionizing said first gas within said chamber by using an indirectly heated cathode having a filament and a cathode;
    supplying a second gas directed at said filament when said cathode and said filament are powered; and
    using said second gas to reduce a pressure of said first gas near said filament.

7. The method of claim 6 wherein said second gas is supplied to said filament via a supply tube.

8. The method of claim 6 wherein said second gas comprises an inert gas.

9. The method of claim 6 wherein said first gas includes dopant species for implantation into a substrate within said ion implanter.

10. The method of claim 6 wherein said first gas is a cleaning gas to remove deposits from interior surfaces of said ion source chamber.

11. The method of claim 10 wherein said cleaning gas includes fluorine.

12. The method of claim 8 further comprising controlling the flow rate of said inert gas in the direction of said filament.

13. The method of claim 8 further comprising controlling the pressure of said inert gas supplied to said tube.

14. The method of claim 6 wherein said second gas is directed at said filament while said first gas is introduced into said ion source chamber.

15. The ion source assembly of claim 4 wherein said filament is located outside of said ion source chamber within a region defined by said cathode, said second gas having a pressure which is higher than a pressure of said first gas proximate said region.

16. An ion source assembly comprising:
an ion source chamber configured to receive a first gas;
an indirectly heated cathode having a filament and a cathode located at a first end of said ion source chamber, said filament located outside of said ion source chamber within a region defined by said cathode and configured to heat said cathode to emit thermo electrons into the ion source chamber; and
a supply tube proximate said filament and said cathode, said supply tube configured to provide a second gas toward said region such that a pressure of said first gas is reduced near said filament, said filament and said cathode configured to be powered when the second gas is provided toward said filament.

* * * * *